(12) United States Patent
Du et al.

(10) Patent No.: US 11,810,896 B2
(45) Date of Patent: Nov. 7, 2023

(54) SUBSTRATE COMPONENT LAYOUT AND BONDING METHOD FOR INCREASED PACKAGE CAPACITY

(71) Applicant: Western Digital Technologies, Inc., San Jose, CA (US)

(72) Inventors: Jiandi Du, Shangai (CN); Zengyu Zhou, Shanghai (CN); Rui Yuan, Shanghai (CN); Fen Yu, Shanghai (CN); Hope Chiu, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 42 days.

(21) Appl. No.: 17/323,132

(22) Filed: May 18, 2021

(65) Prior Publication Data

US 2022/0375896 A1    Nov. 24, 2022

(51) Int. Cl.
*H01L 21/56* (2006.01)
*H01L 25/065* (2023.01)
(Continued)

(52) U.S. Cl.
CPC ........ *H01L 25/0652* (2013.01); *H01L 21/563* (2013.01); *H01L 23/3185* (2013.01);
(Continued)

(58) Field of Classification Search
CPC ......... H01L 21/563; H01L 2924/18161; H01L 2021/60022; H01L 2225/06513; H01L 2224/02135; H01L 2224/02175; H01L 2224/02245; H01L 2224/10145; H01L 2224/10175; H01L 25/0652; H01L 25/0655; H01L 25/0657; H01L 2225/06562; H01L 2225/06506; H01L 2225/0651; H01L 2224/04042;
(Continued)

(56) References Cited

U.S. PATENT DOCUMENTS 7,256,071 B2    8/2007  Lee et al.
7,359,211 B2    4/2008  Landeros et al.
(Continued)

FOREIGN PATENT DOCUMENTS

KR    20110121323 A  * 11/2011  ....... H01L 2224/732

OTHER PUBLICATIONS

Translation of Park, KR-20110121323-A, Nov. 2011 (Year: 2011).*

*Primary Examiner* — Phat X Cao
*Assistant Examiner* — William Henry Anderson
(74) *Attorney, Agent, or Firm* — PATTERSON + SHERIDAN, LLP; Steven H. VerSteeg

(57) ABSTRACT

A method and apparatus for substrate component layout and bonding for increased package capacity. According to certain embodiments, a wire-bonding finger strip is disposed between a flip-chip die and a NAND die stack to reduce a keep out zone (KOZ) required for an underfill material dispensed beneath the flip-chip die. To further inhibit the flow of the underfill material and further reduce the KOZ, a solder mask may be placed adjacent to the flip-chip. According to certain embodiments, there may be at least three sides of the flip-chip that may have such an adjacent solder mask placement. The three sides of the flip-chip according to such embodiments may be those non-adjacent to the wire-bonding finger strip.

20 Claims, 6 Drawing Sheets

(51) Int. Cl.
H01L 25/18 (2023.01)
H01L 23/00 (2006.01)
H01L 23/31 (2006.01)
H01L 25/00 (2006.01)

(52) U.S. Cl.
CPC .............. *H01L 24/16* (2013.01); *H01L 25/18* (2013.01); *H01L 25/50* (2013.01); *H01L 2224/16227* (2013.01); *H01L 2225/06506* (2013.01); *H01L 2225/06517* (2013.01); *H01L 2225/06562* (2013.01); *H01L 2225/06582* (2013.01); *H01L 2924/1431* (2013.01); *H01L 2924/14511* (2013.01); *H01L 2924/18161* (2013.01)

(58) Field of Classification Search
CPC . H01L 2224/04073; H01L 2224/73207; H01L 2224/4899; H05K 2201/10674
See application file for complete search history.

(56) References Cited

U.S. PATENT DOCUMENTS

| | | | |
|---|---|---|---|
| 2014/0001653 A1* | 1/2014 | Kwon | H01L 25/0657 257/777 |
| 2016/0365258 A1* | 12/2016 | Munding | H01L 25/0657 |
| 2020/0273783 A1* | 8/2020 | Sankman | H01L 24/45 |
| 2020/0350288 A1* | 11/2020 | Park | H01L 25/0657 |
| 2021/0066151 A1* | 3/2021 | Hu | H01L 23/10 |
| 2021/0111088 A1* | 4/2021 | Jain | H01L 23/53295 |
| 2021/0407956 A1* | 12/2021 | Noh | H01L 27/11529 |

* cited by examiner

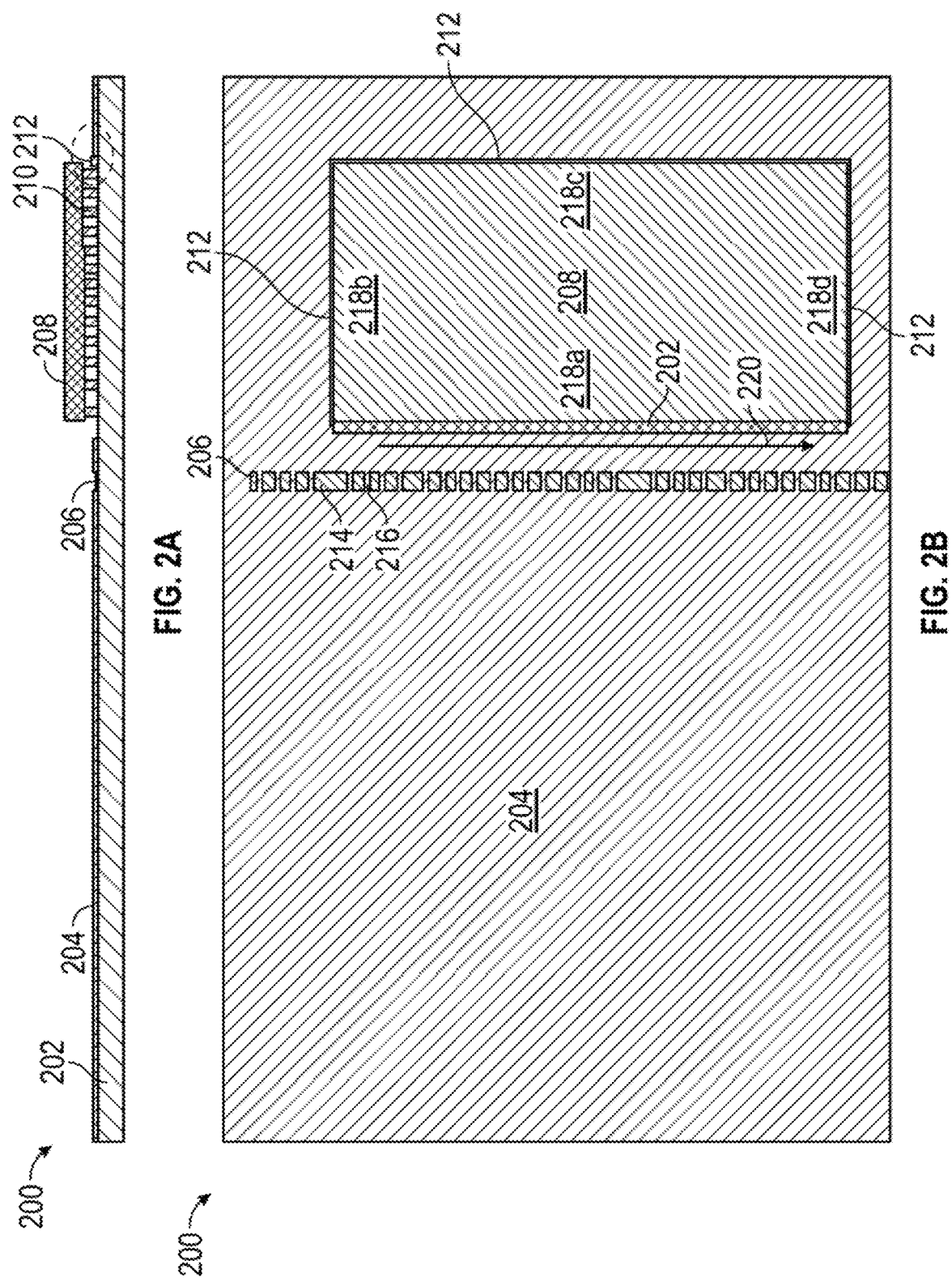

SUBSTRATE COMPONENT LAYOUT AND BONDING METHOD FOR INCREASED PACKAGE CAPACITY

BACKGROUND OF THE DISCLOSURE

Field of the Disclosure

Embodiments of the present disclosure generally relate to packaging for a solid state data storage device (SSD) and, more particularly, to component layout on a NAND mounting substrate.

Description of the Related Art

In the manufacture of a SSD-based data storage device, a flip-chip type controller die and one or more stacked NAND die may be mounted on a substrate such as a printed circuit board. Once mounted on the substrate, the NAND dies may be electrically connected with bond wires to one or more bonding fingers located near an edge of the substrate to facilitate access by the wire-bonding machine. The flip-chip die may be conventionally mounted to the substrate on an opposite side of the substrate from the NAND bonding fingers, with the NAND disposed between the flip-chip die and the bonding fingers.

Once the flip-chip die is mounted, an organic underfill material may be conventionally dispensed so as to flow beneath the flip-chip die to provide protection for the flip-chip to substrate connection. As part of this process, the underfill material flows out beyond the footprint of the flip-chip, which defines a "keep out zone" or KOZ, where other components may not be mounted or otherwise attached to the substrate.

As NAND footprint sizes increase, placing a premium on substrate real estate, the size of the KOZ caused by conventional dispensing of underfill material has a significant impact on the placement of components on the substrate.

What is needed are methods and systems to address the shortcomings of conventional approaches.

SUMMARY OF THE DISCLOSURE

The present disclosure generally relates to products, systems, and methods for substrate component layout and bonding for increased package capacity. According to certain embodiments, a wire-bonding finger strip is disposed between a flip-chip and a NAND die stack to reduce the keep out zone (KOZ) resulting from dispensing an underfill material adjacent to the flip-chip. To further inhibit the flow of the underfill material and further reduce the KOZ, a solder mask may be placed adjacent to the flip-chip. According to certain embodiments, there may be at least three sides of the flip-chip that may have such an adjacent solder mask placement. The three sides of the flip-chip according to such embodiments may be those non-adjacent to the wire-bonding fingers.

In one embodiment, a data storage device is disclosed, including a substrate, a NAND die coupled to the substrate, a flip-chip coupled to the substrate adjacent to the NAND die, and a wire-bonding finger strip positioned on the substrate between the flip-chip and the NAND die.

In another embodiment, a data storage device is disclosed, wherein the data storage device is produced by a method. The method includes placing a wire-bonding finger strip on a substrate, positioning a flip-chip bonding pad to the substrate adjacent to a first side of the wire-bonding finger strip, and positioning a NAND die bonding pad to the substrate adjacent to a second side of the wire-bonding finger strip.

In another embodiment, a data storage device is disclosed that includes a substrate means, a flip-chip means coupled to the substrate means, a first NAND die means coupled to the substrate means at a first distance from the flip-chip means, and a second NAND die means coupled to the first NAND die means at a second distance from the flip-chip means, the second distance being greater than the first distance.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2A is a cross-sectional side view illustrating a substrate component layout, according to certain embodiments.

FIG. 2B is a top plan view of the substrate component layout of FIG. 2A, according to certain embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to the specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to products, systems, and methods for substrate component layout and bonding for increased package capacity. According to certain embodiments, a wire-bonding finger strip is disposed between a flip-chip and a NAND die stack to reduce the keep out zone (KOZ) resulting from dispensing an underfill material adjacent to the flip-chip. To further inhibit the flow of the underfill material and further reduce the KOZ, a solder mask may be placed adjacent to the flip-chip. According to certain embodiments, there may be at least three sides of the flip-chip may have such an adjacent solder mask placement. The three sides of the flip-chip according to such embodiments may be those non-adjacent to the wire-bonding fingers.

Figure 1:
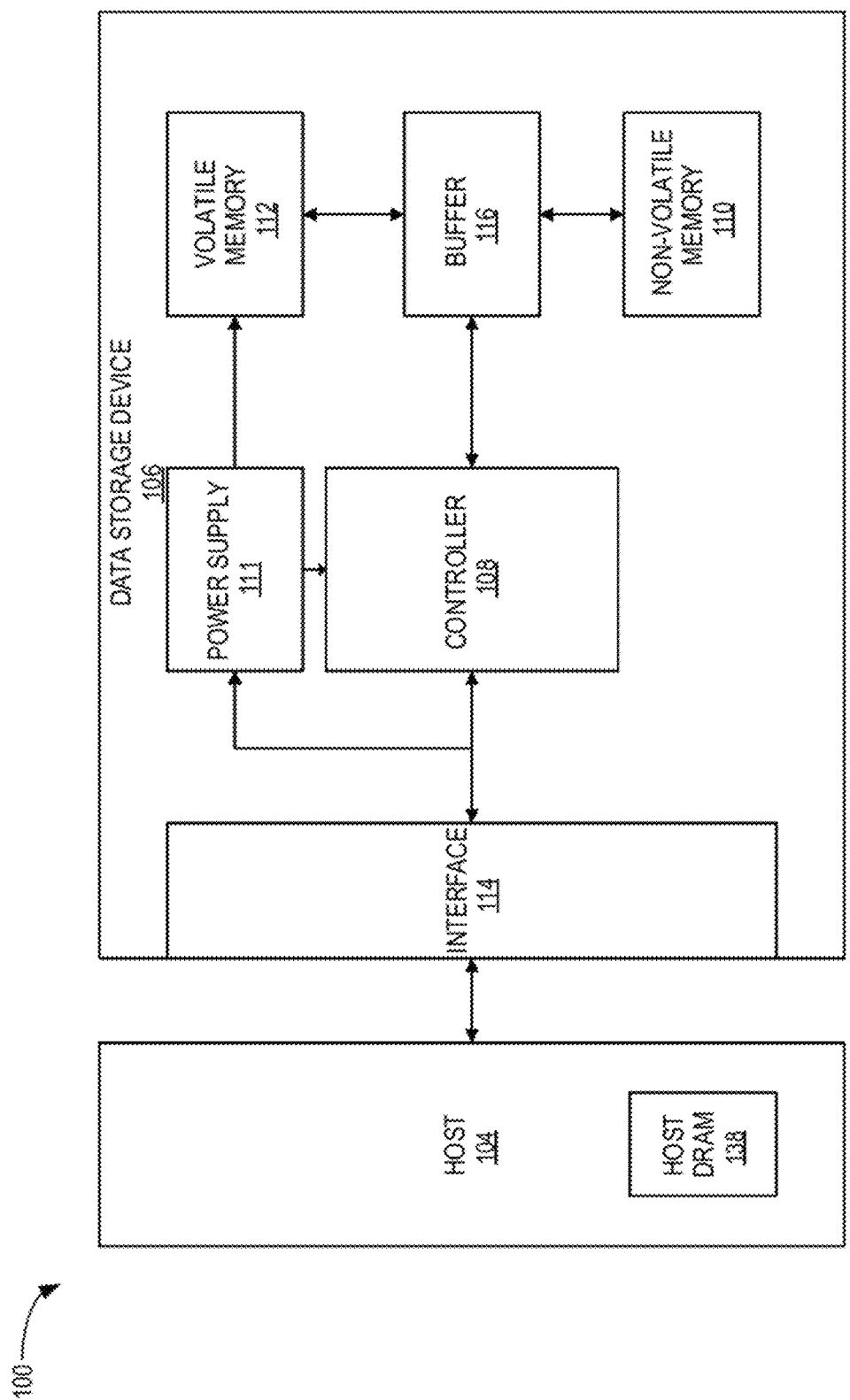
FIG. 1 depicts a schematic block diagram illustrating a storage system in which a data storage device may function as a storage device for a host device, according to certain embodiments.

FIG. 1 depicts a schematic block diagram illustrating a storage system 100 in which data storage device 106 may function as a storage device for a host device 104, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, an interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIex1, x4, x8, x16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit of NVM 110 may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). Controller 108 may write data to and read data from NVM flash memory devices at the page level and erase data from NVM flash memory devices at the block level.

The data storage device 106 includes a power supply 111, which may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, supercapacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may include one or more volatile memory devices. In some examples, controller 108 may use volatile memory 112 as a cache. For instance, controller 108 may store cached information in volatile memory 112 until cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The data storage device 106 includes a controller 108, which may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store the at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

FIG. 2A is a cross-sectional side view illustrating a substrate component layout 200, and FIG. 2B is a top plan view of the substrate component layout 200 of FIG. 2A, according to certain embodiments. In the description herein, aspects of FIG. 2A and FIG. 2B may be discussed simultaneously. Furthermore, it is to be understood that the substrate component layout 200 may include additional components not shown in FIG. 2A and FIG. 2B for the sake of clarity. For example, the substrate component layout 200 may include one or more circuit traces, one or more pads, and the like. The substrate component layout 200 may be included in the data storage device 106 of FIG. 1.

Referring to FIG. 2A, the substrate component layout 200 includes a substrate 202 and a solder mask 204 disposed on the substrate 202. In some embodiments, the solder mask 204 is disposed on one more sides of the substrate 202. A solder mask may be applied to the surface of a substrate such as substrate 202, to prevent adherence of solder, or solder paste, to prevent unintended electrical connections. According to certain embodiments, a solder mask may be applied as an epoxy liquid with a printing technique and thermally cured. In other embodiments, a solder mask may be applied to a substrate as a liquid, cured, and patterned using photolithographic techniques to expose electrical connection points (e.g., pads, or portions of electrically conductive foil layers) for the mounting of electrical components. In certain embodiments, and discussed below, a solder mask may be applied on an underlying solder mask and patterned to form one or more structures such as steps. As discussed below, a solder mask step may prevent the flow or dispersion of liquids such as underfill material provided to a flip-chip.

Referring to FIGS. 2A and 2B, a wire-bonding finger strip 206 is disposed on the substrate 202 and formed through the solder mask 204. As shown in FIG. 2B, the wire-bonding finger strip 206 includes a prepreg substrate 214 that according to certain embodiments is a composite material made from pre-impregnated fibers and a partially cured polymer matrix such as epoxy, phenolic resin, or thermoplastic combined with liquid rubbers or resins, and a plurality of fingers 216. The plurality of fingers 216 may be formed on the prepreg substrate 214 with metallic plating, such as copper plating, and pattern formation. Furthermore, each finger of the plurality of fingers 216 may include nickel (Ni), gold (Au), or a mixture of both Ni and Au, where the weight % of Au is greater than the weight 5 of Ni. It is contemplated that other materials may be applicable, such as aluminum (Au), copper (Cu), and silver (Ag). The wire-bonding finger strip 206 may be positioned a distance, such as between about 600 μm+/−200 μm and about 1000 μm+/−200 μm, away from a first edge 218a of a flip-chip die 208. The previously listed distances are not intended to be limiting but to provide an example of a possible embodiment.

The flip-chip die 208 includes the first edge 218a, a second edge 218b, a third edge 218c, and a fourth edge 218d. The first edge 218a is substantially parallel with the third edge 218c and substantially perpendicular to both the second edge 218b and the fourth edge 218d. The second edge 218b is substantially parallel with the fourth edge 218d and substantially perpendicular to both the first edge 218a and the third edge 218c. The third edge 218c is substantially parallel with the first edge 218a and substantially perpendicular to both the second edge 218b and the fourth edge 218d. The fourth edge 218d is substantially parallel with the second edge 218b and substantially perpendicular to both the third edge 218c and the first edge 218a.

The flip-chip die 208 is coupled to the substrate 202 with a plurality of bumps 210, where the plurality of bumps 210 are in contact with the substrate 202 and the flip-chip die 208. The plurality of bumps 210 may separate the flip-chip die 208 and the substrate 202 by a distance of between about 30 μm+/−15 μm and about 60 μm+/−15 μm. The previously listed distances are not intended to be limiting but to provide an example of a possible embodiment. Each of the plurality of bumps 210 may have a bonding pad, such that the flip-chip die 208 may be electrically coupled to the substrate 202.

Referring to FIG. 2B, a solder mask step 212 is positioned adjacent to the second edge 218b, the third edge 218c, and the fourth edge 218d. As shown in FIG. 2A, at least a portion of the solder mask step 212 is partially disposed between the flip-chip die 208 and the substrate 202 and partially higher than the surrounding solder mask 204. Referring back to FIG. 2B, at least a portion of the substrate 202 may be exposed between the solder mask 204 and the flip-chip die 208. The area between the first edge 218a and the wire-bonding finger strip 206 may be considered a keep out zone (KOZ), such that components and electrical traces, excluding the flip-chip die 208, are not placed within the KOZ. According to certain embodiments, an area between the solder mask step 212 and the second edge 218b, third edge 218c, and fourth edge 218d, may be considered a KOZ. As described below, an underfill is dispensed in a direction 220, or reverse of direction 220, where the underfill is dispensed between the flip-chip die 208 and the wire-bonding finger strip 206. The underfill may be an organic fluid or material that may be kilned at higher temperatures, such as at a temperature of about 150 degrees Celsius or higher. The underfill may protect the flip-chip die 208 and the plurality of bumps 210 from cracking or breaking by covering or encapsulating the bottom of the flip-chip die 208 and the plurality of bumps 210.

FIGS. 3A-3D are photographs illustrating the flow of underfill material beneath a flip-chip die, such as the substrate component layout 200 of FIG. 2, according to a first view 300a, a second zoomed in view 300b, a third zoomed in view 300c, and a fourth zoomed in view 300d, respectively, according to certain embodiments. The second zoomed in view 300b is a zoomed in view of the dashed circled area of the first view 300a. The third zoomed in view 300c is a zoomed in view of the dashed circled area of the second zoomed in view 300b. The fourth zoomed in view 300d is a zoomed in view of the dashed circled area of the third zoomed in view 300c.

Figure 3A:
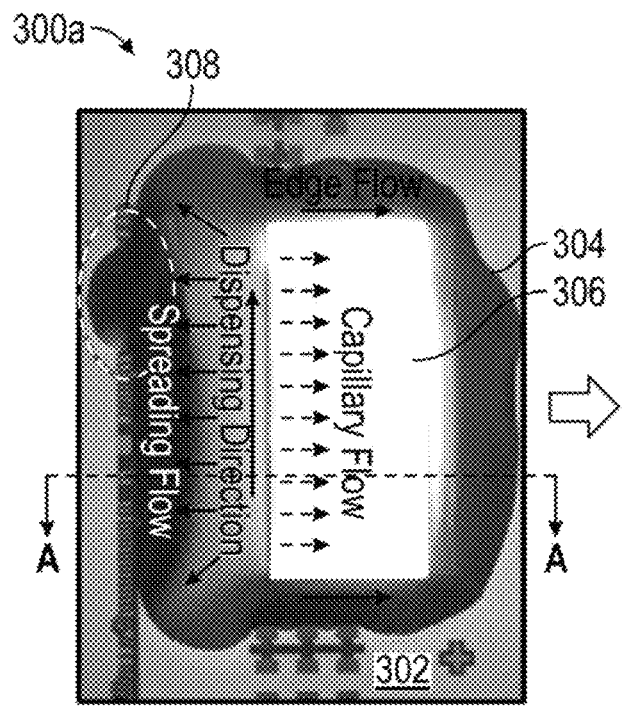
FIGS. 3A-3D are photographs illustrating the flow of underfill material beneath a flip-chip die, according to certain embodiments.

Regarding FIG. 3A, the first view 300a depicts a substrate 302, a wire-bonding finger strip 308, an underfill 304, and a flip-chip 306. The underfill 304 is dispensed in the direction, or reverse of the direction, indicated by the arrow labeled "dispensing direction." When the underfill 304 is dispensed, the underfill 304 spreads in the directions labeled "spreading flow," "capillary flow," and "edge flow." In order to control the flow, such that the underfill 304 does not spread to areas outside of a KOZ, a solder mask step, such as the solder mask step 212 of FIGS. 2A and 2B, and the wire-bonding finger strip 308 are utilized to control the spread of the underfill 304. The solder mask step may prevent the underfill from spreading past the solder mask step by reflecting the direction of the flow at the same angle of incidence as well as generating additional friction due to the height of the solder mask step.

Figure 3B:
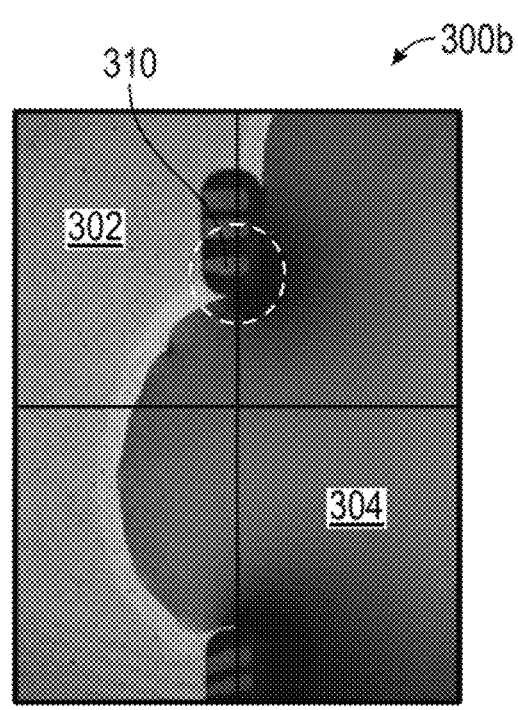

Because of the surface tension generated between the wire-bonding finger strip 308 and the underfill 304, the "spreading flow" may be hindered from spreading past the wire-bonding finger strip 308. Referring to FIG. 3B, the second zoomed in view 300b illustrates the surface tension generated between the plurality of fingers 310 of the wire-bonding finger strip 308 and the underfill 304. This surface tension is generated by the edge of a solder mask step 312 adjacent to wire-bonding finger strip 308. As shown in the location absent of the plurality of fingers 310, the underfill 304 is spreading past a threshold generated by the wire-bonding finger strip 308.

Figures 3C, 3D:
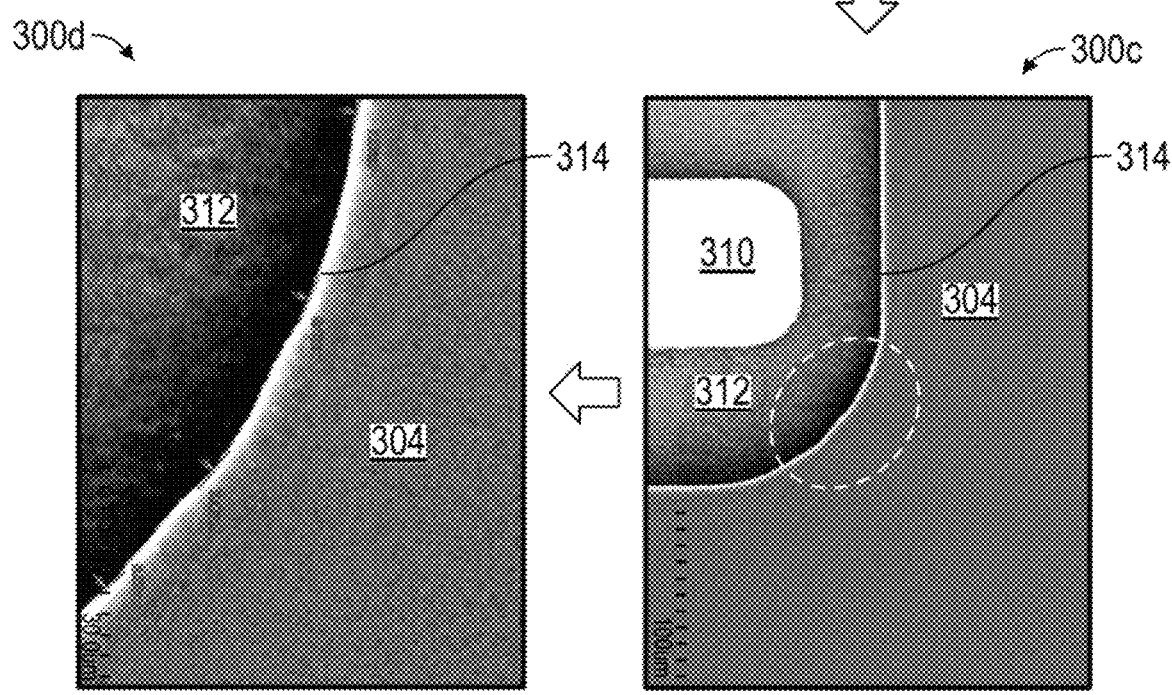

Referring to FIG. 3C, a boundary 314 is generated due to the surface tension between the underfill 304 and solder mask step 312 adjacent to wire-bonding finger strip 308. Furthermore, because of the surface tension, a space or a gap between the boundary 314 and each of the plurality of fingers 310 may be present, as shown in FIG. 3C. FIG. 3D is a zoomed in view of FIG. 3C illustrating the boundary 314.

Figure 3E:
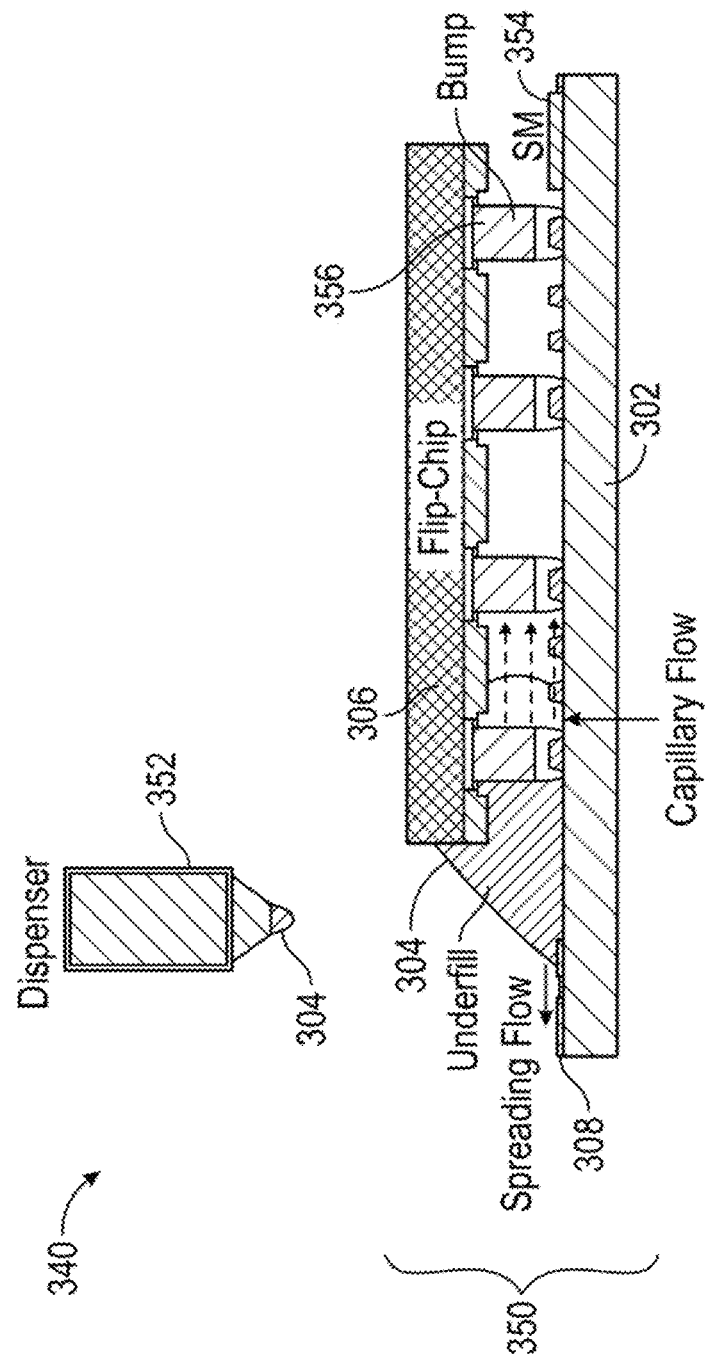
FIG. 3E is a cross-sectional side view illustrating the dispensing of an underfill material beneath the flip-chip die, according to certain embodiments.

FIG. 3E is a cross sectional side view 340 illustrating the dispensing of an underfill material beneath the flip-chip die, according to certain embodiments. Aspects of the substrate component layout 350 may be similar to the substrate component layout 200 of FIGS. 2A and 2B. A dispenser 352 dispenses the underfill 304 between the wire-bonding finger strip 308 and the flip-chip 306. The underfill 304 spreads towards the wire-bonding finger strip 308 and underneath the flip-chip 306. Because of the surface tension generated between the solder mask step 312 adjacent to wire-bonding finger strip 308 and the underfill 304, the underfill 304 may be hindered from spreading past the wire-bonding finger strip 308. Furthermore, in order to stop or hinder the underfill 304 from spreading past the flip-chip 306 on the opposite side of the wire-bonding finger strip 308, a solder mask (SM) step 354 is utilized, where the SM step 354 may prevent or restrict the spread or flow of the underfill 304.

A plurality of bumps 356 support the flip-chip 306 and are coupled to the substrate 302. When the underfill 304 spreads underneath the flip-chip 306 and is heated up, the underfill 304 is kilned and acts to protect the flip-chip 306 and the plurality of bumps 356 from cracking and other types of damage.

Figure 4:
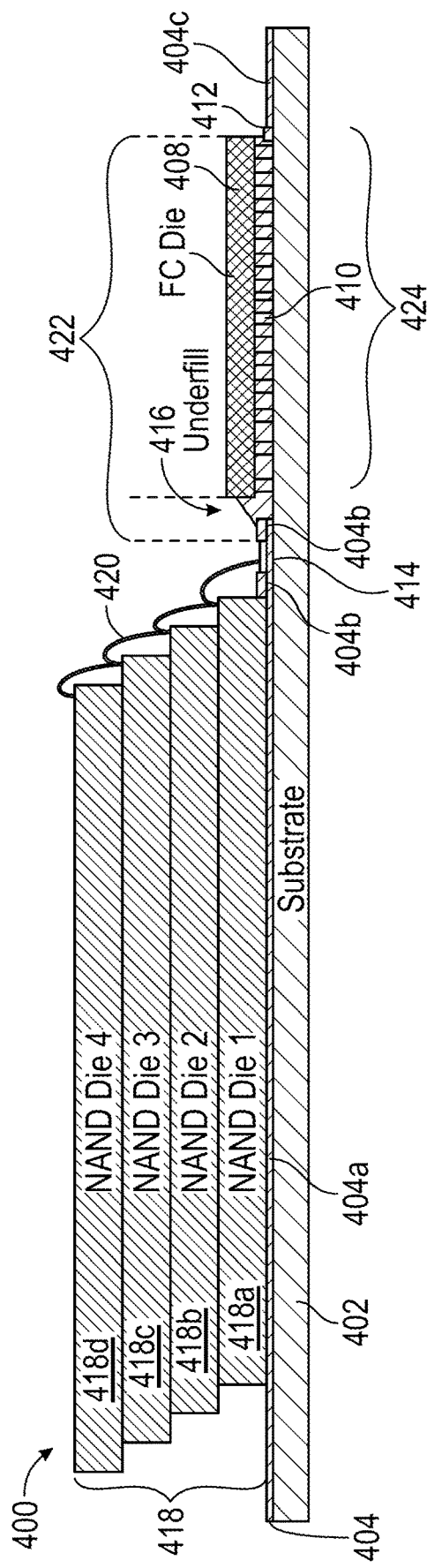
FIG. 4 is a cross-sectional side view of an assembled SSD, according to certain embodiments.

FIG. 4 is a cross-sectional side view 400 of an assembled SSD, according to certain embodiments. The substrate component layout 400 may be the substrate component layouts 200, 350 of FIGS. 2A, 2B, and 3E. A solder mask 404 is disposed on a substrate 402. A wire-bonding finger strip 414 is formed through the solder mask 404 and is in contact with the substrate 402. Although the substrate component layout 400 depicts the solder mask 404 having a first solder mask portion 404a, a second solder mask portion 404b, and a third solder mask portion 404c separated from each other, it is to be understood that the solder mask portions 404a, 404b, 404c may be a single solder mask 404, which may be represented by the top view of the substrate component layout 200 of FIG. 2B.

The first solder mask portion 404a may be of a width greater than the width of the second solder mask portion 404b and the width of the third solder mask portion 404c. The second solder mask portion 404b may be of a width less than the width of the third solder mask portion 404c. The second solder mask portion 404b is bounded by the wire-bonding finger strip 414 on a first side and an opening 424 on a second side. The opening 424 includes a plurality of bumps 410 coupling a flip-chip 408 to the substrate 402. A solder mask step 412 is positioned at least partially between the substrate and the flip-chip 408 and has a height greater than the solder mask 404.

A plurality of NAND dies 418 are stacked one atop another with a bottom NAND die 418a disposed on the first solder mask portion 404a. Although four NAND dies 418a-418d are depicted, it is to be understood that any number of NAND dies are contemplated and may be applicable to the described embodiments. Each of the NAND dies 418a-418d may comprise only memory circuitry or have an architecture such as CMOS under Array and the like, in which case some control logic circuitry is associated with each NAND die. The first NAND die 418a is positioned a first distance from the wire-bonding finger strip 414. The second NAND die 418b is positioned a second distance from the wire-bonding finger strip 414. The third NAND die 418c is positioned a third distance from the wire-bonding finger strip 414. The fourth NAND die 418d is positioned a fourth distance from the wire-bonding finger strip 414. The first distance is less than the second distance, the second distance is less that the third distance, and the third distance is less than the fourth distance. Each of the NAND dies 418a-418d are coupled to the substrate with bond wires 420, such that data may be transferred between each of the NAND dies 418a-418d. The bond wire 420 is attached to the wire-bonding finger strip 414.

An underfill 416 is deposited between a flip-chip die 408 and the second solder mask portion 404b. The underfill 416 spreads between the wire-bonding finger strip 414 and the solder mask step 412. Because of the surface tension generated between the wire-bonding finger strip 414 and the underfill 416, the underfill 416 is hindered or stopped from spreading past the wire-bonding finger strip 414. Likewise, the solder mask step 412 may hinder or stop the underfill 416 from spreading past the solder mask step 412. Thus, the area that the underfill 416 spreads to or is contained within may be considered a KOZ 422. In one embodiment, the flip-chip die 408 positioned closest to the wire-bonding finger strip 414 is positioned a distance between about 600 μm+/−200 μm and about 1000 μm+/−200 μm from the wire-bonding finger strip 414.

Figure 5:
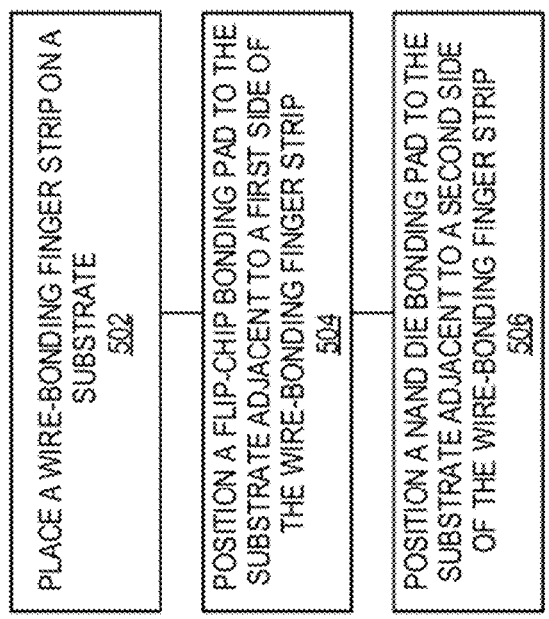
FIG. 5 depicts a flow diagram illustrating a method of increasing package capacity through an improved substrate component layout, according to certain embodiments.

FIG. 5 depicts a flow diagram illustrating a method 500 of increasing package capacity through an improved substrate component layout, according to certain embodiments. Increasing package capacity means that, for example, a larger die may be disposed within the package without having to change the overall dimensions of the package (length×width) because the substrate layout provided in this disclosure allows for a reduced KOZ so more of the substrate area is useable for component layout. The improved substrate component layout may be the substrate component layout 400 of FIG. 4. At block 502, a wire-bonding finger strip is formed on a substrate 402. At block 504, a flip-chip bonding pad is positioned on the substrate adjacent to a first side of the wire-bonding finger strip. At block 506, a NAND die bonding pad is positioned on the substrate adjacent to a second side of the wire-bonding finger strip. The wire-bonding finger strip is the location on the substrate where substrate bonding pads are formed for electrically connecting the NAND dies to the substrate (and thus to other substrate connected components). In the embodiments shown, NAND die are physically connected to the substrate or solder mask with a bonding pad such as an adhesive (e.g., a glue, epoxy, or a material that bonds by heat or pressure) dispensed on the substrate or solder mask, and electrically connected to the substrate bonding pads with bond wires. The bond wires may be copper or gold, plated or unplated, coated or uncoated, as is known in the art.

By placing the wire-bonding finger strip between the flip-chip bonding pad and the NAND die, the KOZ may be decreased allowing for greater area on the substrate to place additional NAND components.

In one embodiment, a data storage device is disclosed, including a substrate, a NAND die coupled to the substrate, a flip-chip coupled to the substrate adjacent to the NAND die, and a wire-bonding finger strip positioned on the substrate between the flip-chip and the NAND die.

The data storage device further includes a solder mask step positioned adjacent to a side of the flip-chip. The solder mask step may be at least partially disposed beneath the side of the flip-chip. The solder mask step may be positioned adjacent three sides of the flip-chip. The solder mask step may be at least partially disposed beneath the three sides of the flip-chip. The data storage device further includes an organic underfill material positioned beneath the flip-chip and extending to the wire-bonding finger strip. The organic underfill material extends to the solder mask step.

In another embodiment, a data storage device is disclosed, wherein the data storage device is produced by a method. The method includes placing a wire-bonding finger strip on a substrate, positioning a flip-chip bonding pad to the substrate adjacent to a first side of the wire-bonding finger strip, and positioning a NAND die bonding pad to the substrate adjacent to a second side of the wire-bonding finger strip.

The method further includes placing a first solder mask step adjacent to a first side of the flip-chip bonding pad. The first solder mask step is positioned to be at least partially beneath a first side of a flip-chip coupled to the flip-chip bonding pad. The method further includes placing a second solder mask step adjacent to a second side of the flip-chip bonding pad. The first solder mask step is positioned to be at least partially beneath a first side of a flip-chip coupled to the flip-chip bonding pad and the second solder mask step is positioned to be at least partially a second side of the flip-chip coupled to the flip-chip bonding pad. The method further includes coupling a flip-chip to the flip-chip bonding pad and dispensing an organic underfill material adjacent to the flip-chip and the wire-bonding finger strip. The method further includes halting the flow of the organic underfill material at one of the finger strip and the first solder mask step.

In another embodiment, a data storage device is disclosed that includes a substrate means, a flip-chip means coupled to the substrate means, a first NAND die means coupled to the substrate means at a first distance from the flip-chip means, and a second NAND die means coupled to the first NAND die means at a second distance from the flip-chip means, the second distance being greater than the first distance.

The data storage device further includes a wire-bonding finger means disposed between the flip-chip means and the first NAND die means. The first NAND die means and second NAND die means are coupled to the wire-bonding finger means. The data storage device further includes an organic underfill material disposed between the flip-chip means and the substrate, and extending between the flip-chip means and the wire-bonding finger means. The data storage device further includes a solder mask step means disposed adjacent to the flip-chip means such that at least a portion of the flip-chip means is disposed between the solder mask step means and the wire-bonding finger means. The solder mask step means is disposed at least partially beneath the flip-chip means.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
   a substrate;
   a solder mask disposed on the substrate;
   a NAND die mounted on a first portion of the solder mask;
   a flip-chip die mounted on the substrate adjacent to the NAND die; and
   a wire-bonding finger strip formed through a second portion of the solder mask and in contact with the substrate between the flip-chip die and the NAND die, wherein the second portion of the solder mask is bounded by the wire-bonding finger strip on a first side and an opening on a second side, wherein the opening includes a plurality of bumps coupling the flip-chip die to the substrate, wherein the wire-bonding strip is above the substrate, wherein the second portion of the solder mask is on the first portion of the solder mask and the second portion of the solder mask is in contact with the NAND die.

2. The data storage device of claim 1, wherein the solder mask comprises a solder mask step positioned adjacent to a side of the flip-chip die.

3. The data storage device of claim 2, wherein the solder mask step is at least partially disposed beneath the side of the flip-chip die.

4. The data storage device of claim 2, wherein the solder mask step is positioned adjacent to three sides of the flip-chip die.

5. The data storage device of claim 4, wherein the solder mask step is at least partially disposed beneath the three sides of the flip-chip die.

6. The data storage device of claim 2, further comprising an organic underfill material positioned beneath the flip-chip die and extending to the wire-bonding finger strip.

7. The data storage device of claim 6, wherein the organic underfill material extends to the solder mask step.

8. The data storage device of claim 7, further comprising bond wires extending between bond pads of the NAND die and the wire-bonding finger strip for electrically connecting the NAND die to the substrate.

9. The data storage device of claim 8, further comprising a molding compound covering the NAND die, the flip-chip die and the bond wires.

10. A data storage device, wherein the data storage device is produced by a method comprising:
   disposing a solder mask on a substrate;
   forming a wire-bonding finger strip through a second portion of the solder mask and in contact with the substrate;
   positioning a flip-chip bonding pad to the substrate adjacent to a first side of the wire-bonding finger strip;
   positioning a NAND die bonding pad to a first portion of the solder mask adjacent to a second side of the wire-bonding finger strip opposite to the first side; and
   bounding the second portion of the solder mask to the wire-bonding finger strip on a first side and an opening on a second side, wherein the opening includes a plurality of bumps coupling a flip-chip die to the substrate, wherein the wire-bonding strip is above the substrate, wherein the second portion of the solder mask is on the first portion of the solder mask and the second portion of the solder mask is in contact with the NAND die.

11. The data storage device of claim 10, the method further comprising placing a first solder mask step adjacent to a first side of the flip-chip bonding pad.

12. The data storage device of claim 11, wherein the first solder mask step is positioned to be at least partially beneath a first side of the flip-chip die coupled to the flip-chip bonding pad.

13. The data storage device of claim 11, the method further comprising placing a second solder mask step adjacent to a second side of the flip-chip bonding pad.

14. The data storage device of claim 13, wherein the first solder mask step is positioned to be at least partially beneath a first side of the flip-chip die coupled to the flip-chip bonding pad and the second solder mask step is positioned to be at least partially beneath a second side of the flip-chip die.

15. The data storage device of claim 11, the method further comprising coupling the flip-chip die to the flip-chip bonding pad and dispensing an organic underfill material adjacent to the flip-chip die and the wire-bonding finger strip, wherein flow of the underfill material is halted at least at one of the finger strip and the first solder mask step.

16. A data storage device, comprising:
   a substrate means for providing electrical communications between components mounted thereon;
   a solder mask disposed on the substrate means;
   a flip-chip die mounted on and coupled to the substrate means;
   a first NAND die mounted on a first portion of the solder mask and positioned at a first distance from the flip-chip die;
   a second NAND die coupled to the first NAND die and positioned at a second distance from the flip-chip die, the second distance being greater than the first distance; and
   a wire-bonding finger strip means, formed through a second portion of the solder mask and in contact with the substrate means between the flip-chip die and the first and second NAND dies, for providing electrical connections between the first and second NAND dies and the substrate means, wherein the second portion of the solder mask is bounded by the wire-bonding finger strip means on a first side and an opening on a second side, wherein the opening includes a plurality of bumps coupling the flip-chip die to the substrate means, wherein the wire-bonding strip means is above the substrate means, wherein the second portion of the solder mask is on the first portion of the solder mask and the second portion of the solder mask is in contact with the first NAND die.

17. The data storage device of claim 16, wherein the first and second NAND dies are coupled to the wire-bonding finger strip means with bond wires.

18. The data storage device of claim 17, further comprising an organic underfill material disposed between the flip-chip die and the substrate means, and extending between the flip-chip die and the wire-bonding finger strip means.

19. The data storage device of claim 18, further comprising a solder mask step means disposed adjacent to the flip-chip die such that at least a portion of the flip-chip die is disposed between the solder mask step means and the wire-bonding finger strip means.

20. The data storage device of claim 19, wherein the solder mask step means is disposed at least partially beneath the flip-chip die.

* * * * *